US008146029B2

(12) United States Patent
Ghica

(10) Patent No.: US 8,146,029 B2
(45) Date of Patent: Mar. 27, 2012

(54) SYNTHESIS OF ELECTRONIC CIRCUITS

(75) Inventor: Dan-Razvan Ghica, Birmingham (GB)

(73) Assignee: The University of Birmingham, Birmingham (GB)

( * ) Notice: Subject to any disclaimer, the term of this patent is extended or adjusted under 35 U.S.C. 154(b) by 507 days.

(21) Appl. No.: 12/351,507

(22) Filed: Jan. 9, 2009

(65) Prior Publication Data

US 2009/0158235 A1    Jun. 18, 2009

(30) Foreign Application Priority Data

Jul. 14, 2006  (GB) .................................. 0614019.8

(51) Int. Cl.
*G06F 17/50*  (2006.01)
(52) U.S. Cl. ....................................... 716/104
(58) Field of Classification Search .................... 716/104
See application file for complete search history.

(56) References Cited

U.S. PATENT DOCUMENTS

| 6,889,366 | B2 * | 5/2005 | Hamlin | 716/102 |
| 2003/0005393 | A1 * | 1/2003 | Kawamoto | 716/3 |
| 2005/0149884 | A1 * | 7/2005 | Hamlin | 716/1 |

OTHER PUBLICATIONS

Hanchate et al., "A game-theoretic framework for multimetric optimization of interconnect delay, power, and crosstalk noise during wire sizing", Proceedings of the 41st annual Design Automation Conference, Jun. 2004.*
Dasgupta, "Game Theory and its Application to VLSI Physical Design", Citeseer, 2008.*
Samson Abramsky et al: "Applying Game Semantics to Compositional Software Modeling and Verification," Tools and Algorithms for the Construction and Analysis of Systems Lecture Notes in Computer Science;; LCNS, Springer-Verlag, BE, vol. 2988, 2004, pp. 421-435.
International Search Report for PCT/GB2007/002603, dated Oct. 29, 2007.
Murugavel, A. K. et al: "Gate sizing and buffer insertion using economic models for power optimization," VLSI Design, 2003, Proceedings, 17th International Conference on Mumbai, India Jan. 5-7, 2004, Los Alamitos, CA USA, IEEE, Jan. 5, 2004, pp. 195-200.
Murugavel, A. et al., "A game-theoretic approach for binding in behavioral synthesis," VLSI Design, 2003, Proceedings, 16th International Conference on Jan. 4-8, 2003, Piscatawy, NJ, USA, IEEE, Jan. 4, 2003.

* cited by examiner

*Primary Examiner* — Jack Chiang
*Assistant Examiner* — Brandon Bowers
(74) *Attorney, Agent, or Firm* — Goodwin Procter LLP

(57) ABSTRACT

The invention relates to a method of synthesizing an electronic circuit for performing a function. The method comprises programming the function using a programming language by defining one or more terms, each term comprising one or more functional constants. Game semantics are applied to interpret the programmed function. Each term is interpreted as one or more strategies defined on moves. Each of the constants of the programmed function is associated with a sub-circuit. Each move is associated with at least one input or output port of the associated sub-circuit, and a move occurrence defined by a strategy produces a change of state of an associated port. The associated sub-circuits are combined to provide a synthesized circuit for performing the function.

9 Claims, 9 Drawing Sheets true false skip asg der seq

SYNTHESIS OF ELECTRONIC CIRCUITS

This application is a national stage of International (PCT) Patent Application Serial No. PCT/GB2007/002603, filed Jul. 11, 2007, and published under PCT Article 21(2) in English, which claims the benefit of and priority to G.B. Patent Application Serial No. 0614019.8, filed Jul. 14, 2006, each of which is incorporated herein by reference in its entirety.

The present invention relates to a method for synthesising electronic circuits.

Electronic devices are used in a huge variety of computational and control applications. Designers of these devices specify an electronic system that is required to perform a certain function. This then has to be translated into a specification of the actual hardware and layout of the device components.

In the design of electronic devices and electronic systems (e.g. System-on-a-Chips or SoCs), a semiconductor intellectual property core, (IP core) is a proprietary reusable unit of logic, cell, or chip layout design. IP cores can be used as building blocks within ASIC chip designs or FPGA (Field Programmable Gate Array) logic designs. The designer is able to select appropriate IP cores from a database or library of available IP cores.

In digital-logic applications, IP cores are typically offered as generic gate netlists. A netlist is a boolean-algebra representation of the IP core's logical-function, and protects the vendor (proprietor) against reverse-engineering. Some versions of IP cores are synthesizable and are provided in a hardware description language such as Verilog or VHDL, permitting user modification at the functional level.

To design and build a SoC or FPGA requires an initial specification of the function that the device is required to perform in a form that can be used to identify the IP cores required from the hardware description language. In general, it is considered desirable that the starting point for the synthesis of the hardware circuits is definition of the required function of the device in a high level programming language, such as C, C++, C#, Java, Pascal etc. These languages are useful because, by their nature, they are expressive. However, this expressiveness means that they are not readily transformed into the hardware specification. One major obstacle is the non-linear nature of such languages—that is the fact that a procedure and its argument may have global identifiers in common. In particular, circuits that are synthesised using known techniques, tend to be over-elaborate and inefficient in terms of the amount of memory (number of flip-flops) and amount of wiring required.

It is an object of the present invention to provide an improved method of synthesising electronic circuits.

According to the present invention there is provided A method of synthesising an electronic circuit for performing a function, the method comprising:

programming said function using a programming language by defining one or more terms, each term comprising one or more functional constants;

applying game semantics to interpret the programmed function, wherein each term is interpreted as one or more strategies defined on moves;

associating each of said constants of the programmed function with a sub-circuit that comprises at least one input port and at least one output port, wherein each move is associated with at least one input or output port of the associated sub-circuit, and wherein a move occurrence defined by a strategy produces a change of state of an associated port; and combining the associated sub-circuits to provide a synthesised circuit for performing said function.

In embodiments of the invention, each term of said programmed function is a sub-program comprising identifiers, procedure definitions and linear procedure calls. Each sub-program is preferably assigned one or more types and describes an operation on an argument, whereby each move is determined by the type of the programmed function and the types of its identifiers. Preferably, the language is a linear-typed language, except that non-linear types are defined by use of a SHARE operation on an argument that returns two or more copies of the argument.

In embodiments of the invention, the sub-circuit is configured such that a sequence of inputs/outputs to the ports corresponds with a strategy.

In embodiments of the invention, the step of combining the associated sub-circuits comprises wiring together the associated sub-circuits. The step of combining the associated sub-circuits may comprise wiring the associated sub-circuits that correspond to a procedure call to the sub-circuits that correspond to the argument.

It is an advantage that by applying game semantics to define the types of the constants of the (high level) programming language, moves can be associated with the input and output ports of a hardware sub-circuit and procedure calls can be interpreted just by wiring of the circuits representing the procedure and its arguments. For this to be realisable requires the definition of the procedures and the procedure calls to be linear in that they do not possess any sharing of variable identifiers. This association of the program types with the ports of a circuit can then readily be converted to the hardware description language from which an IP core can be identified.

The synthesis of procedure calls requires linear typing, meaning that identifiers are restricted to unique occurrences. This restriction means the use of the high level language is much less expressive than if non-linear typing were permitted. It is an advantage that the share command alleviates this restriction.

Embodiments of the invention will now be described by way of an example, with reference to the following drawings, in which:

FIG. 5b is a Mealy-style diagram for part of the circuit of FIG. 5a;

Figure 1:
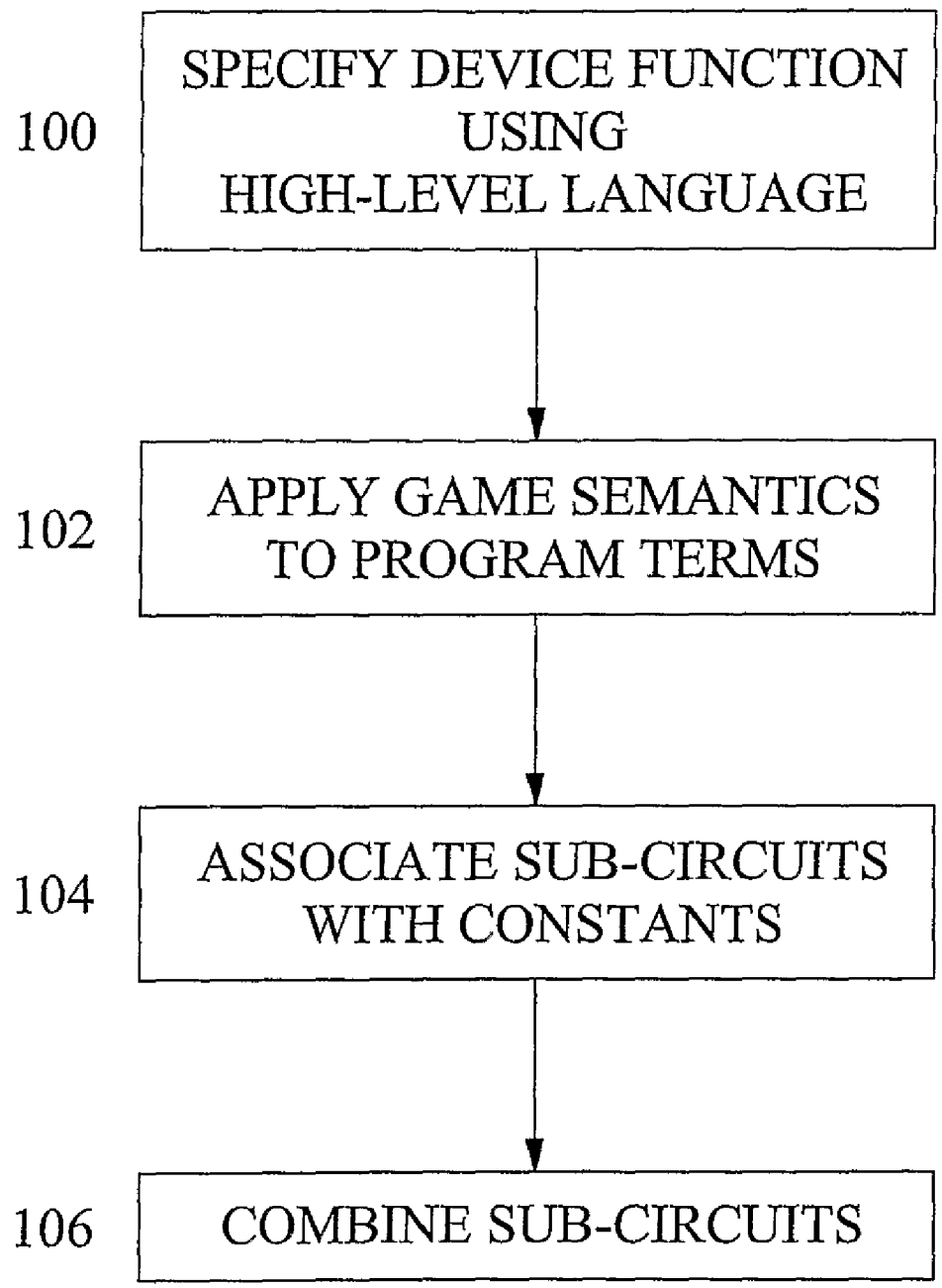
FIG. 1 is a flow chart showing the principal stages involved in synthesis of an electronic circuit in accordance with the present invention.

Referring to FIG. 1, the first step 100 in synthesising an electronic circuit, is to specify the function of the device. This is most readily undertaken by the designer using a suitable high-level programming language. Having completed this specification of the function, further steps must be performed to translate the programmed definition of the device's function into the hardware circuits required to build the device. In accordance with the principles of the present invention, these steps include applying game semantics 102 to the terms of the programmed function, associating each of the constants of the programmed function with a sub-circuit 104, and combining the associated sub-circuits 106 to provide a synthesised circuit for the device The first step 100 may be applied using any programming language that includes procedures or similar features (functions, methods, etc.) Examples include C, C++, C#, Java, Pascal etc. For the following illustrative purposes it is clearer if we select a language, which we shall call ICA. A more detailed description of ICA can be found in Ghica, D. R., and Murawski, A. S. "Angelic semantics of fine-grained concurrency"—FoSSaCS (2004), pp. 211-225. This language has the essential imperative and procedural features required, but is "theoretically clean", having a cleaner syntax and semantics (simpler and clearer presentation) than many other languages.

We will give a type-direct presentation of the language. The base types of the language are commands, variables, semaphores and (Boolean) expressions:

$$\sigma ::= com | var | sem | bool.$$

Additionally, the language contains higher-order-types of the form $$\theta ::= \sigma | \theta \rightarrow \theta | \theta \times \theta,$$

i.e. functions and products.

Some other common types such as integers or arrays are omitted for simplicity, as they can be readily encoded in this smaller language. In the examples given we may assume the existence of integers or arrays, with their obvious encodings.

Terms (sub-programs) are formed from constants, abstraction (procedure definition) and application (procedure call). The language constants are show in Table 1.

TABLE 1

| | |
|---|---|
| 1: bool | constant |
| 0: bool | constant |
| skip: com | no-op |
| asg: var → bool → com | assignment |
| der: var → bool | dereferencing |
| seq: com → com → com | sequencing |
| seq: com → bool → bool | sequencing with boolean |
| par: com → com → com | parallel execution |
| op: bool → bool → bool | logical operations |
| if: bool → com → com → com | branching |
| while: bool → com → com | iteration |
| grb: sem → bool | grab semaphore |
| rls: sem → bool | release semaphore |
| newvar: (var → com) → com | local variable |
| newsem: (sem → com) → com | Local semaphore |

This functionalised syntax may seem peculiar but it is highly convenient. A more conventional syntax can be readily encoded into this. For example, the program

```
bool x;
if (y) {
    x = z && t;
}
else {
    x = z || t;
}
``` can be written using functionalised syntax as:

newvar($\lambda x$. if $y(asg(and(derefz)(dereft))x)(asg(or(derefz)(dereft))x))$ Obviously, the former is more readable but the latter is more convenient for presenting the language. This difference is not one of substance.

Terms have types, described by typing judgements of the form $$\Gamma \vdash M : \theta,$$

where $\Gamma = x_1 : \theta_1, \ldots x_n : \theta_n$ is a variable type assignment, M is a term and $\theta$ the type of the term.

The rules for abstraction and application are linear, in the sense that when we apply a function to its arguments they are not allowed to share variable identifiers. Linear-style type systems have, in general, been used in programming languages to control or limit resource usage, particularly memory usage. For hardware synthesis every circuit, or sub-circuit, is a resource that cannot be shared arbitrarily, which makes linear typing highly relevant.

Non-linear typing is much more widely used than linear typing. This is because linear typing is much less expressive, since it restricts variables to unique occurrences. For example common terms such as x=x+1 cannot be typed linearly because the variable identifier x occurs twice. Some typing systems such as bunched types deal with this problem by identifying in what contexts non-linear typing can be used safely, but such systems are also quite restrictive.

Embodiments of the present invention take a different approach. We will introduce a new operation in the language, $$share_\theta : \theta \rightarrow (\theta \times \theta)$$

which returns two copies of the argument.

Using this operation it can be mathematically proved that we end up with a language that is ultimately as expressive as a non-linearly typed language. For example, the term x=x+1 can be written, using share as $x : var \vdash (\lambda(y,z).asgx(add(dery)1))(share_{var} x).$ Although the linear-typed language with explicit sharing is as expressive as the non-linear typed language with implicit sharing, the former gives a very precise handle on sharing variable identifiers, which will be seen to be essential in managing sharing of circuits.

Finally, to keep the syntactic clutter to a minimum we assume that currying and uncurrying of functions is done automatically when required.

Several common features are missing from this language:

recursion We can only allow iteration or some limited forms of tail recursion. The reason is foundational: full recursion requires the full power of a computer and is prima facie incompatible with germane hardware synthesis, which is finite state.

pointers Dynamic memory fits awkwardly with the static nature of hardware. Dynamic-memory-style operations for managing external memory can be provided, however. This is not a conceptual limitation, but a technical complication.

control Jumps and exceptions can be introduced in this framework following game semantic models for control.

The next step 102 in the method illustrated in FIG. 1 involves applying game semantics to the program terms. Without going into the full technical details of game semantics, the main points are as follows:

1. Each term is interpreted by sets of sequences of actions. The actions are called moves, the sequences plays, and the sets strategies.
2. The moves used in the strategies of a term are defined by the type judgement of the term. As a particular move may occur more than once in a strategy, each occurrence of a move is referred to as a move occurrence.

3. There is a well-defined notion of composition of strategies that corresponds to composition of terms through application.

For details the reader is referred to Ghica, D. R., and Murawski, A. S. "Angelic semantics of fine-grained concurrency"—FoSSaCS (2004), pp. 211-225.

The moves associated with a signature (the types that appear in the type judgement) are given by the following set constructions:

$P_{com} = \{run, ok\}$ $P_{bool} = \{q, tt, ff\}$ $P_{var} = \{read, tt, ff, write.tt, write.ff, ok\}$ $P_{sem} = \{grab, release, ok\}$ $P_{\theta \times \theta'} = P_\theta \uplus P_{\theta'}$ $P_{\theta \to \theta'} = P_\theta \uplus P_{\theta'}$ $P_{\Gamma, x:\theta} = P_\Gamma \uplus P_\Gamma$ $P_\emptyset = \emptyset$ $P_{\Gamma \vdash M:\theta} = P_\Gamma \uplus P_\theta.$ Step 104 of FIG. 1 involves associating each of the constants of the programmed function with a sub-circuit. The term sub-circuit is used here to mean a circuit (i.e. an electronic circuit in the normal sense), but to differentiate this from the overall electronic circuit that will eventually make up the device. As one example, the game semantic interpretation of ICA constants can be modelled as finite-state transducers as follows:

associate with any ICA constant a digital circuit (sub-circuit)

associate with any input move an input port (except for the Boolean moves tt, ff)

associate with an output move an output port associate with any move occurrence a change of state of the port.

The association of ports to boolean moves tt, ff is different:

we use a 2-bit bus one of the bits is for data (0=ff, 1=tt)

the other bit is a 'ready' bit data can be considered valid only in the clock cycle when the 'ready' bit toggles the same scheme (data+'ready' bit) is used in the encoding of integer moves.

Treating booleans (and integers) as a special case is done for efficiency reasons, to reduce the amount of circuitry required to encode the ICA constants, by replacing stateful circuits with combinatorial wherever possible.

Once these associations have been made, the synthesis of the associated transducers is standard. Whenever convenient we will present a schematic of the circuit. Otherwise, we will present the circuit as a Mealy-style transducer in the following way: an action on a transition (either input or output) must be interpreted as a toggle of the logical value on the port of the circuit; if we need a specific value b on the port A we write A=b.

Examples of associated sub-circuits for the constants true (1), false (0), no-op (skip), assignment (asg), dereferencing (der) and sequencing (seq) are shown in FIGS. 2a-2f. Example sub-circuits for associating the constants grab and release of semaphores (grb and rls) as well as sequencing of commands are similarly straightforward. Note that these sub-circuits are very fast and economical to implement. Moreover, there is an advantage that when these sub-circuits are combined to synthesise a larger circuit many of them will be reduced to simple wiring. This simplification cannot be achieved using prior art methods that involve fetch-and-execute synthesis methods.

Figure 2A:
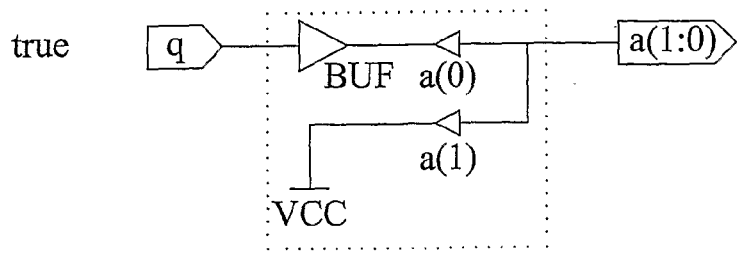
FIGS. 2a to 2p are circuit diagrams, including schematic and Mealy-style diagrams of sub-circuits used in a synthesis method according to the invention.
Figure 2B:
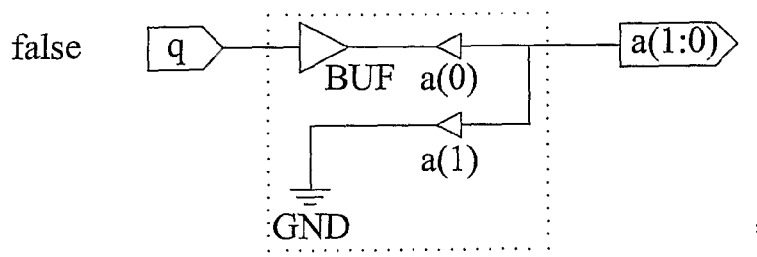
Figure 2C:
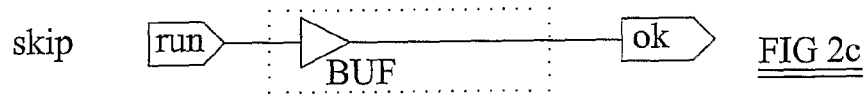
Figure 2D:
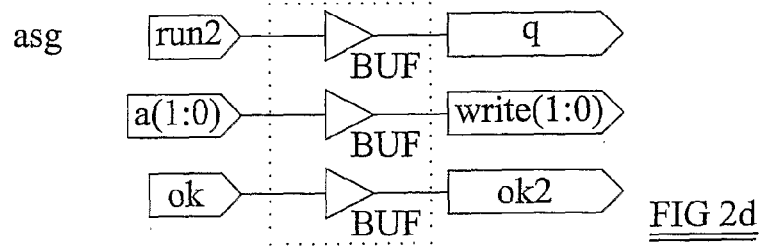
Figure 2E:
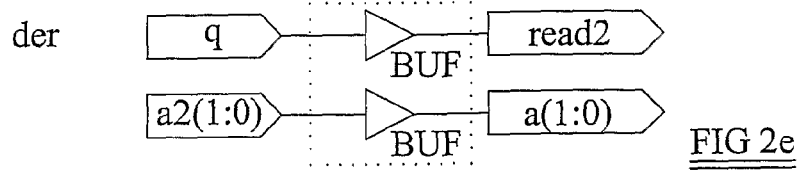
Figure 2F:
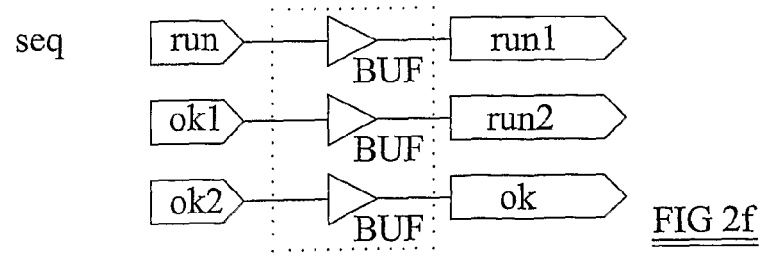
Figure 2G:
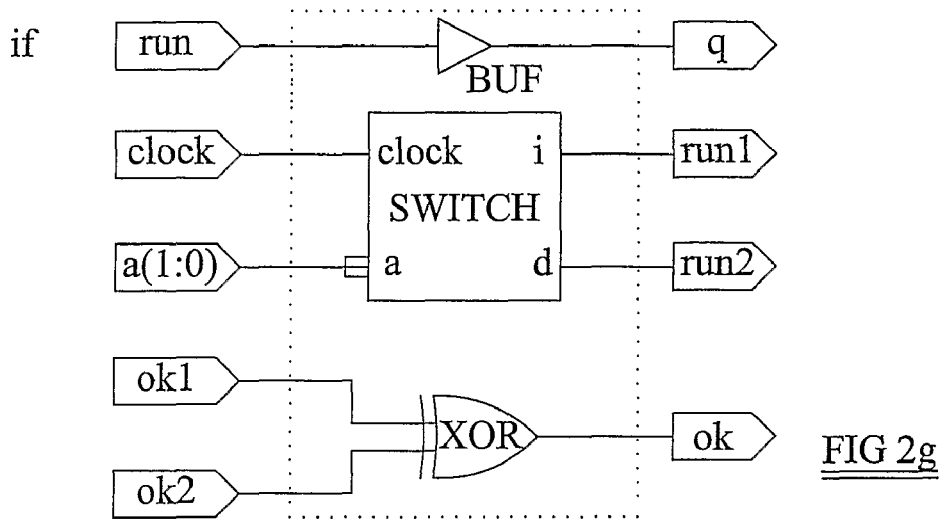
Figure 2H:
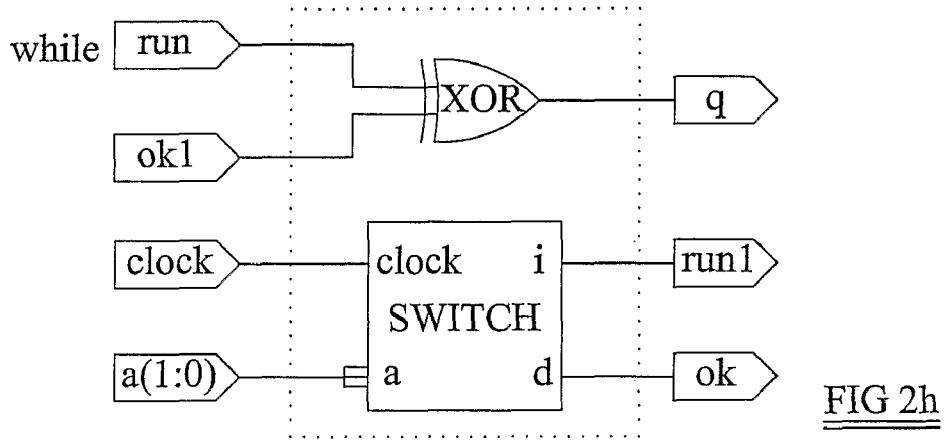
Figure 2I:
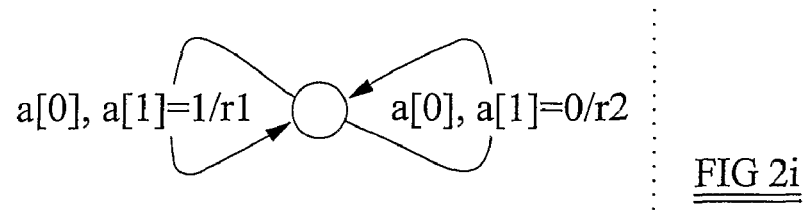
Figure 2J:
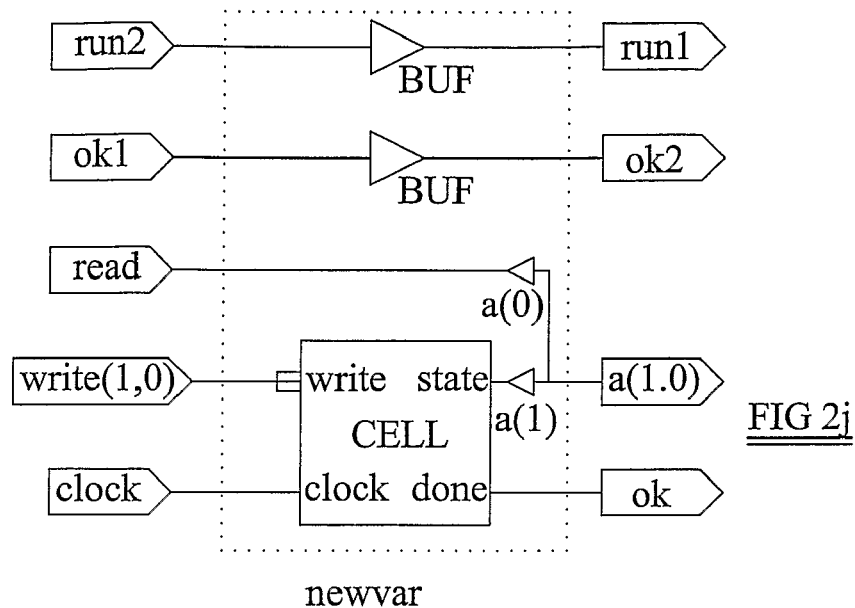
Figure 2K:
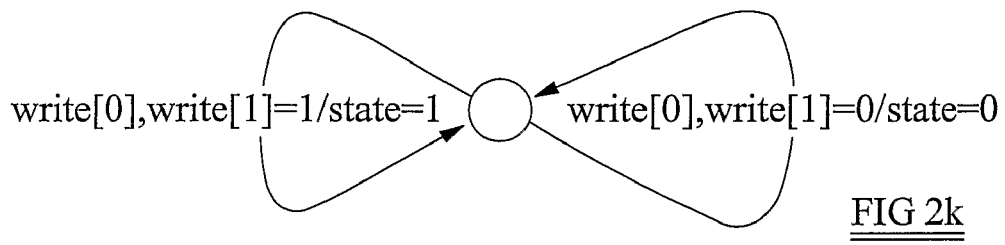

Example sub-circuits for the branching (if) and iteration (while) constants are shown in FIGS. 2g and 2h, where we assume that the circuits SWITCH with behaviour as indicated in the Mealy-style diagram of FIG. 2i. For the local variable declaration constant (newvar), the associated sub-circuit is shown in FIG. 2j, with an auxiliary circuit CELL defined by the Mealy-style diagram of FIG. 2k.

Figure 2L:
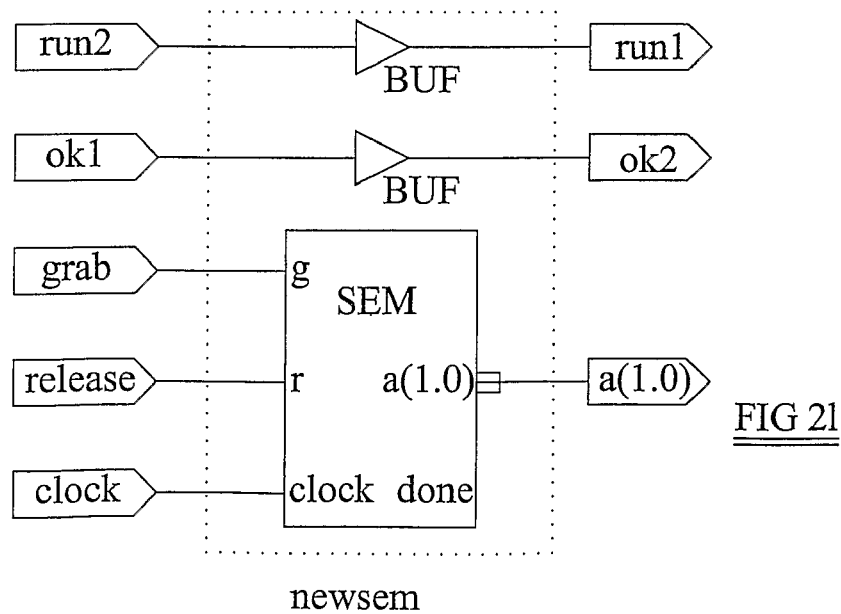
Figure 2M:
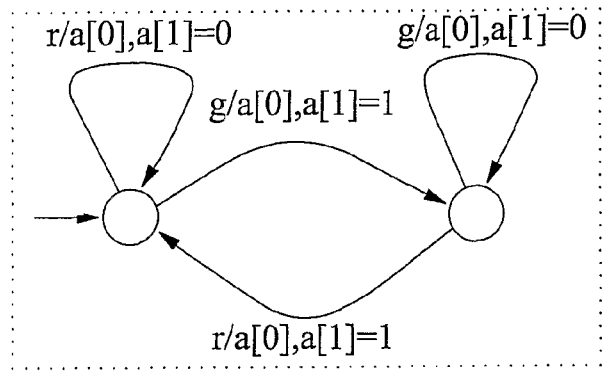

For the local semaphore declaration constant (newsem) an example of an associated sub-circuit is shown in FIG. 2l, with an auxiliary circuit SEM defined by the Mealy-style diagram of FIG. 2m. This is the most expensive sub-circuit defined so far. When synthesised using Xilinx Verilog the circuit incorporates five flip-flops. However, it may be possible to manually design a more efficient circuit to provide this functionality. Also, the semaphore declaration sub-circuit does not provide any mutexing functionality, and, in fact, if used concurrently (for example if grab and release constants are called simultaneously) the behaviour is arbitrary. We will discuss this issue further below in relation to the sharing operation.

Figure 2N:
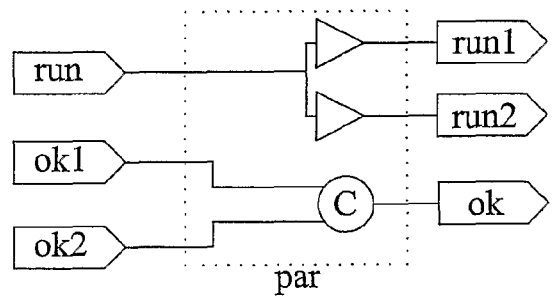

Concurrent execution of commands requires a similarly elementary circuitry in the form of a Mueller C-element as shown in FIG. 2n.

Figure 2O:
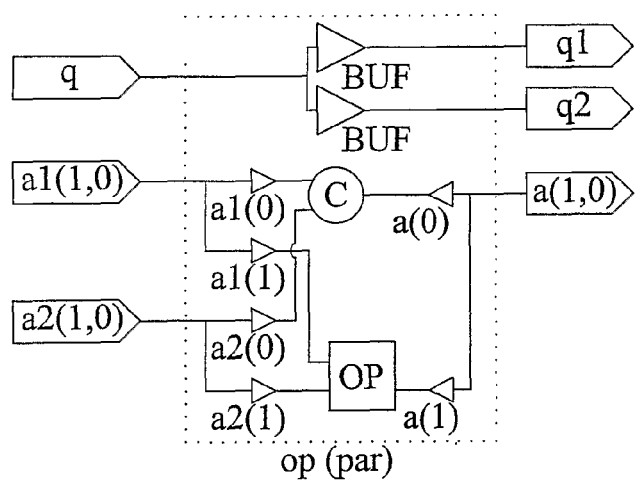
Figure 2P:
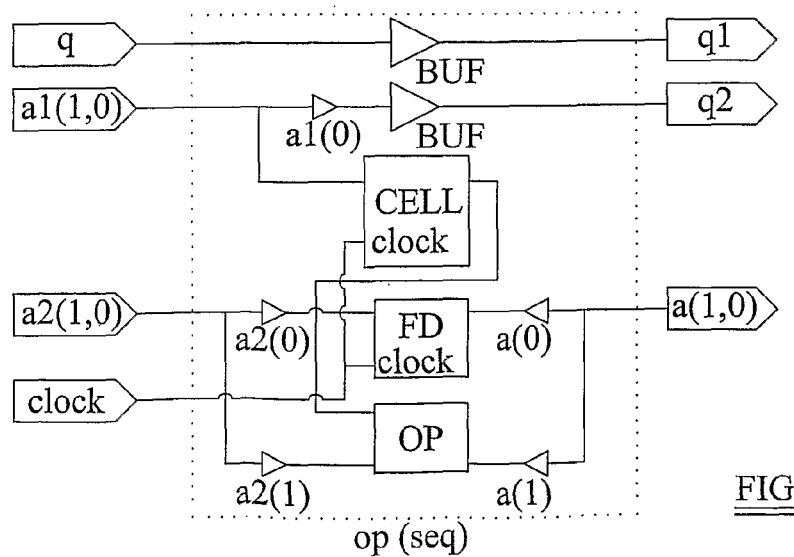

Logical operators can be provided in either sequential or parallel versions, as shown in the sub-circuits of FIGS. 2o and 2p, in which the auxiliary CELL circuit saves the state of a1(1) when a1(0) toggles.

The above illustrates that the application of game semantics leads to economical circuits. However, the real strength of the method lies in the implementation of abstraction (procedure definition) and application (procedure call) as relabelling of ports and, respectively, wiring of circuits, when the sub-circuits are combined (step 106 of FIG. 1).

But first let us look at free identifiers: because this compilation method is compositional it must handle any sub-program, including that consisting of just one variable. The type judgement for such a program is $x:\theta_l \vdash x:\theta_r.$ The game semantic interpretation for the free identifier is the so-called copy-cat strategy: any input move is replicated onto the output. Synthesised, this is simply wiring from the input ports associated with the moves of $\theta_l$, $\theta_r$ to the output ports of the moves of the same types.

For abstraction, let us consider the typing rule again:

$$\frac{\Gamma, x:\theta \vdash M:\theta'}{\Gamma \vdash \lambda x \cdot M:\theta \to \theta'}$$

This indicates that interpretation of a procedure with argument x should be derived from that of a term with free variable identifier x. Indeed, in game semantics this is simply a relabelling of the moves associated with $\Gamma, x:\theta$ and $\theta'$ to moves associated with $\Gamma$ and $\theta \to \theta'$. In other words, any circuit that represents a program with x as a free variable identifier can be considered as a procedure taking x as an argument. This means that procedure definition does not require any additional circuitry at all.

Figure 3:
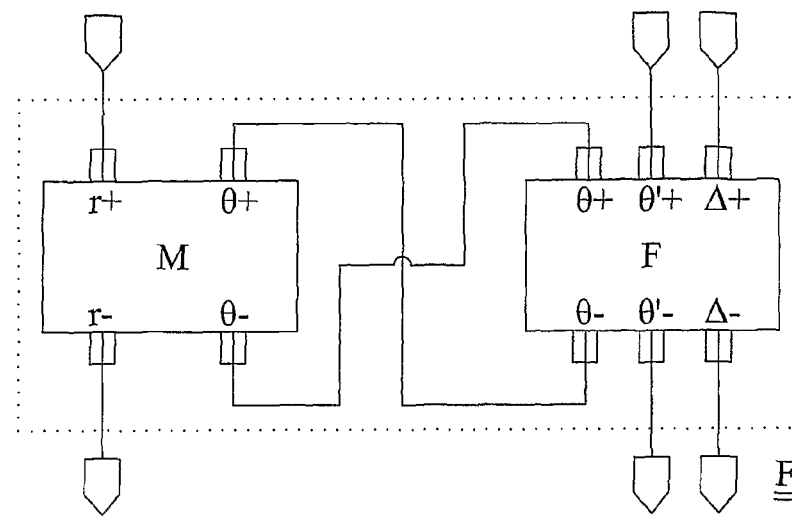
FIG. 3 is a schematic diagram of a circuit synthesised in accordance with the invention.

Finally, (linear) application (procedure call) is interpreted in game semantics as composition of strategies. However, it can be shown that this corresponds to wiring the inputs of the procedure to the outputs of the argument, and vice versa. Explicitly, the circuit synthesised for the application $$\frac{\Gamma \vdash F:\theta \longrightarrow \theta' \Delta \vdash M:\theta}{\Gamma, \Delta \vdash FM:\theta'}$$

is shown in FIG. 3.

As an example of what we have seen above, the circuit to calculate the procedure (in C-like syntax)

Figure 4A:
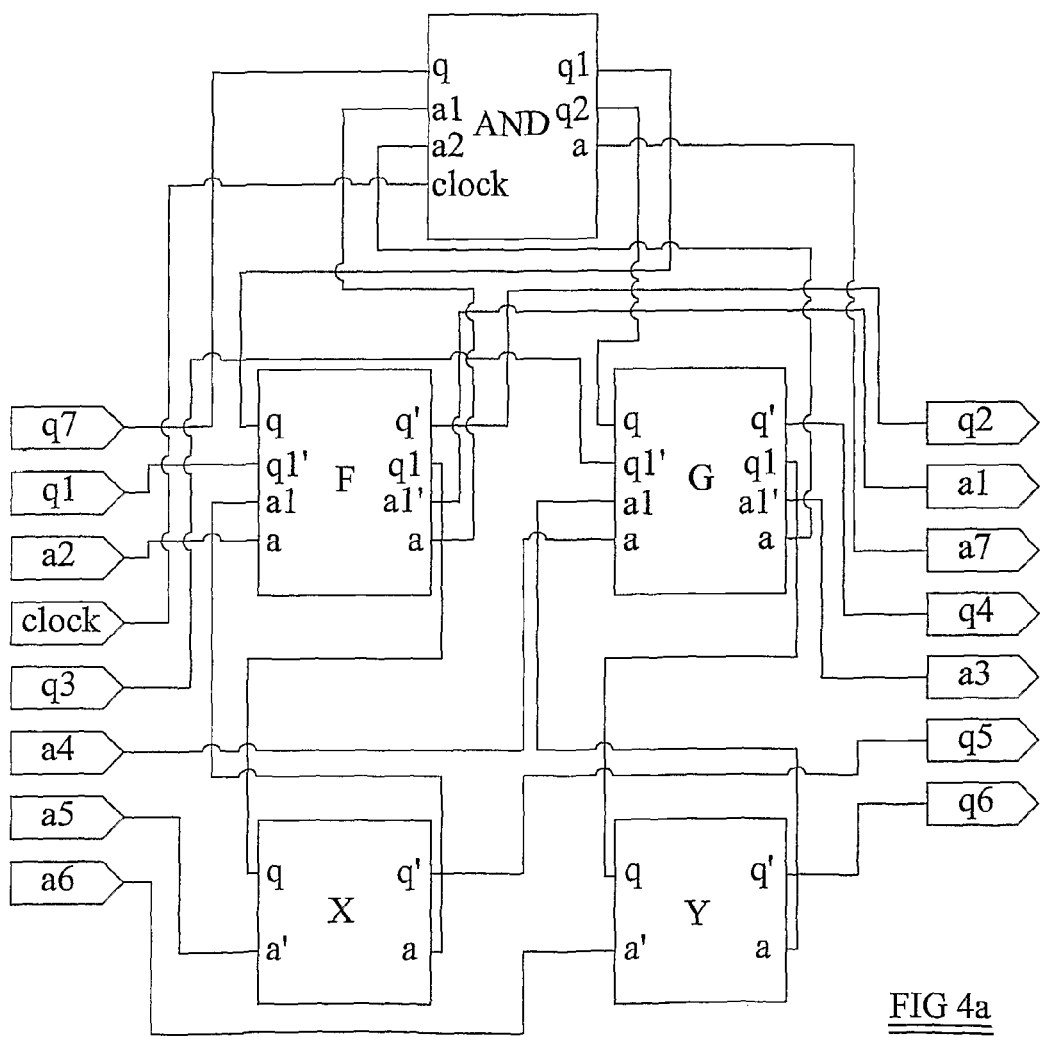
FIGS. 4a and 4b are further examples of circuits synthesised in accordance with the invention.
Figure 4B:
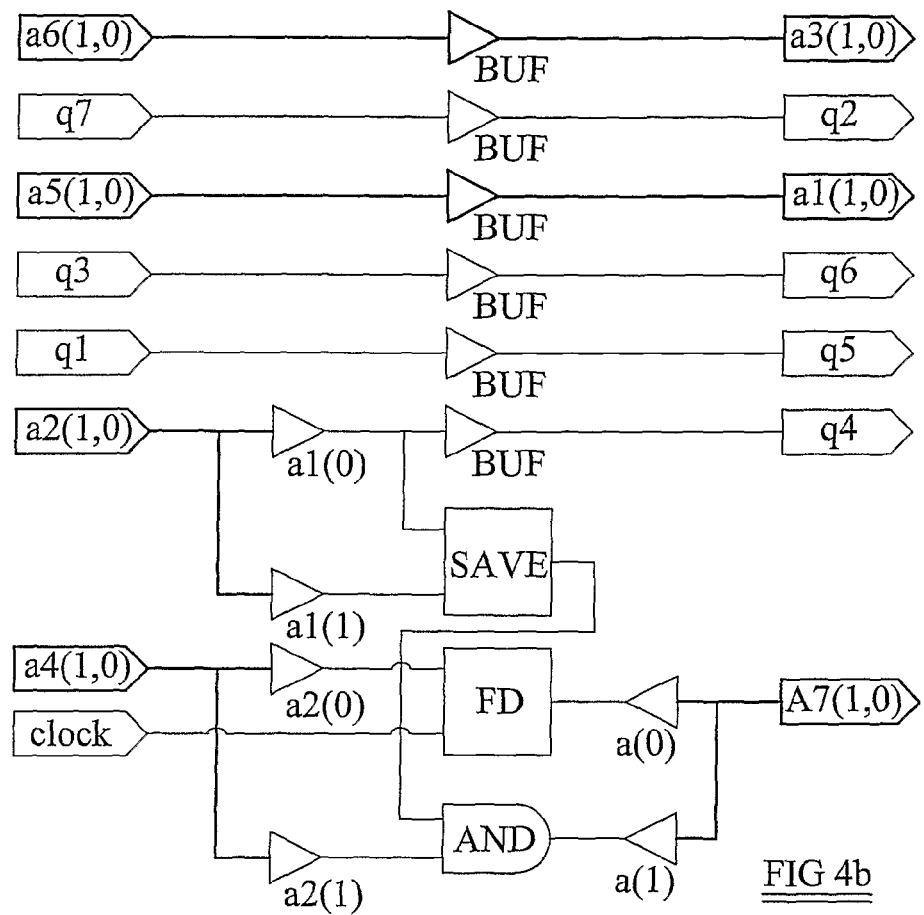

```
bool add(bool (*f)(bool), bool (*g)(bool), bool x, bool y) {
    return f(x) && f(y);
}
``` written in our functionalised syntax as $\lambda f.\lambda g.\lambda x.\lambda y.\text{and}(fx)(gy):(\text{bool}_1 \to \text{bool}_2) \to$
$(\text{bool}_3 \to \text{bool}_4) \to \text{bool}_5 \to \text{bool}_6 \to \text{bool}_7$.

is shown in FIG. 4a. However, most of the boxes contain only internal wires, which can be straightened to arrive at the circuit shown in FIG. 4b.

By this point we have seen that all the structural information in the program (variables, abstraction, application) is simply encoded in the way circuits are wired. Many program primitives (constants, assignment, variable manipulation, semaphore manipulation, sequencing) are also just wiring. The only non-trivial functionality is done by local declarations and by the arithmetic-logic operators. The reason for this lies in the linearity of the application rule: in our programs we only use variables exactly once. This is a key simplification. However, as already indicated above, this simplification is also places limitations on the expressiveness of the programming language. In order to get over these limitations we need to sneak non-linearity back in using the share operation:

$\text{share}_\theta : \theta_1 \to (\theta_2 \times \theta_3)$.

Figure 5A:
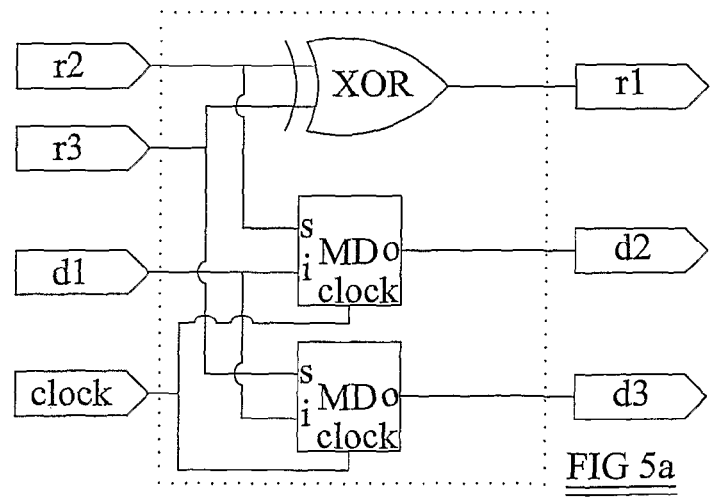
FIG. 5a is a schematic circuit diagram for a sharing operation.
Figure 5B:
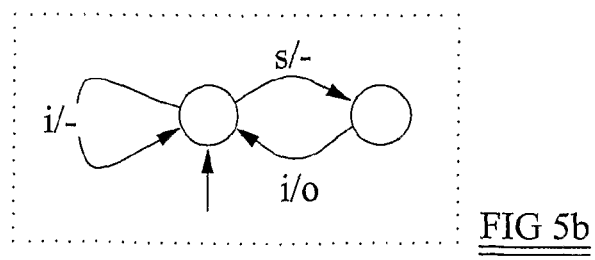

The game semantics of share is as follows:
the first move will be in $\theta_2$ or $\theta_3$ and it will be an input move
the component where the move occurred is remembered
a copy of the move is issued on $\theta_1$
the next move accepted is an input move on $\theta_1$
a copy of the move is issued on the remembered component
repeat this cycle A simple example sub-circuit for share is shown in FIG. 5a. The auxiliary circuit MD serves the following purpose: whenever the select line s toggles the input line i becomes "open" until i itself toggles, and it is "closed" back, as shown in the Mealy-style diagram of FIG. 5b.

The circuit MD as specified above is actually quite complex, a standard implementation requiring 4 flip-flops and 8 gates. However, a hand-crafted special-purpose circuit could offer a more light-weight solution for the same functionality.

In general, $\text{share}_\theta$ may be synthesised by the following algorithm:

```
for each input move k in theta
    create one output port I1k
    create two input ports I2k and I3k
    connect the three using a XOR gate
connect all I2k ports to a XOR gate with output I2
connect all I3k ports to a XOR gate with output I3
for each output move k in theta
```

```
    create one input port O1K
    create two output ports O2k and O3k
    create two instances of MD
    connect port S of MD to I2, port I to O1k, port O to O2k
    connect port S of MD to I3, port I to O1k, port O to O3k
connect all instances of MD to a common clock port
```

Figure 6:
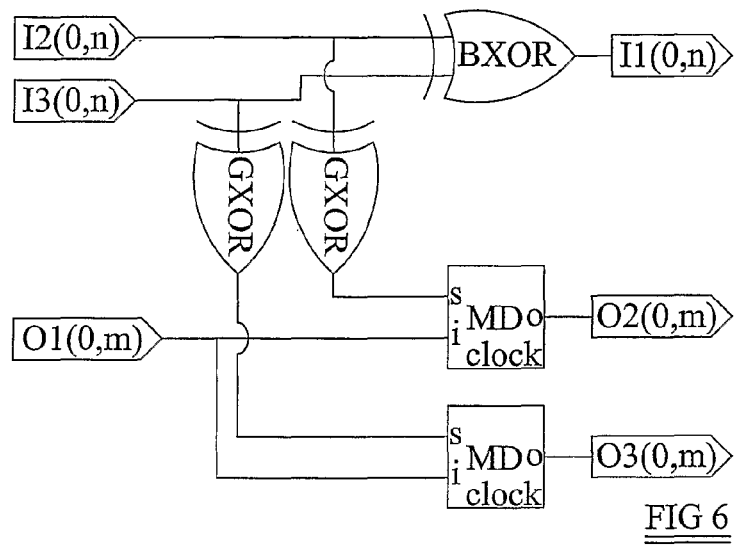
FIG. 6 is a schematic circuit diagram that corresponds to the diagram of FIG. 5b.

Schematically this is shown in FIG. 6, where GXOR is the global XOR of all the ports in the bus and EXOR is the bit-wise XOR of the two buses; the first one requires an n-ary gate and the second one n binary gates. If n=1 we replace the GXOR gate with wire.

Let us look at a simple example, a procedure that executes its argument twice. In C-like syntax this would be:

```
void twice (void (*c) ()) {
    c( ) ; c ( ) ;
    return ;
}
```

Figure 7:
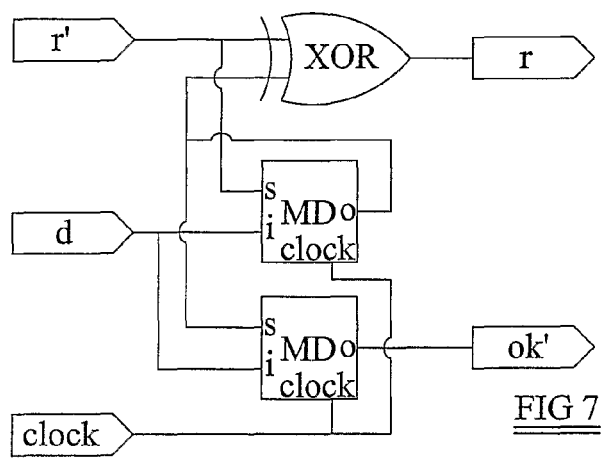
FIGS. 7 and 8 are further examples of circuits synthesised in accordance with the invention.

In the streamlined syntax this procedure is $\lambda c.\text{seqcc}$. Using sharing and re-establishing linearity, the same is written as $\lambda c.\text{seq}(\text{share}_{com}c): \text{com} \to \text{com}'$. The synthesised sub-circuit is shown in FIG. 7.

It is clear that the most expensive operation to implement is sharing, which requires rather complex multiplexing and de-multiplexing of the signal to and from the shared components. It is therefore wise to use sharing only when absolutely necessary, by using replication instead. The simplest illustration of replication versus sharing is our synthesis of basic circuits: we could only use one circuit for each operation, then share them whenever it is used in the program. But this would be very inefficient, so instead we use copies of each such circuit.

More concretely, if a component M is shared, as in $((\lambda x \lambda y.F)(\text{share} x))(M)$ It may be more efficient to transform this program in the equivalent program $(\lambda x \lambda y.F)(M_1)(M_2),$ where $M_1$ and $M_2$ are instances of M where all free variable-identifiers have been replace with distinct ones.

Whether it is more efficient to share or replicate can be calculated precisely at compile-time by measuring the amount of circuitry needed to synthesise M and to share x, and choosing the least expensive alternative.

In general mixing sharing and concurrency leads to the well-known problem of racing conditions. Two processes attempting to access shared resource concurrently usually results in bad behaviour. In the context of concurrent programming, the shared resources causing problems are, in general, memory variables. In the context of hardware synthesis this problem may arise whenever sharing is attempted, not only of variables but of any circuits. Consider, for example, the case of a procedure that runs its argument twice concurrently, rather than sequentially. In linearised notation, this is written as:

$\lambda c.\text{par}(\text{share}_{com}c):\text{com} \to \text{com}'.$

Figure 8:
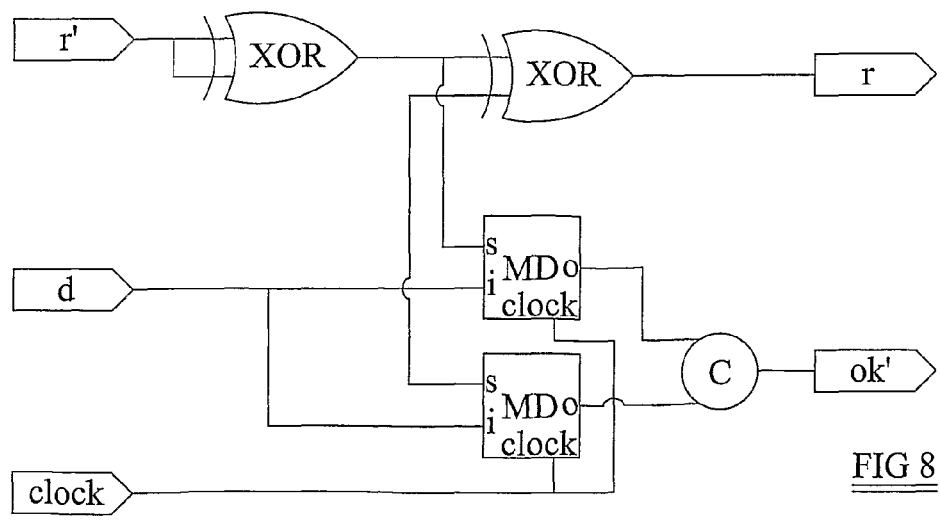
Figure 9:
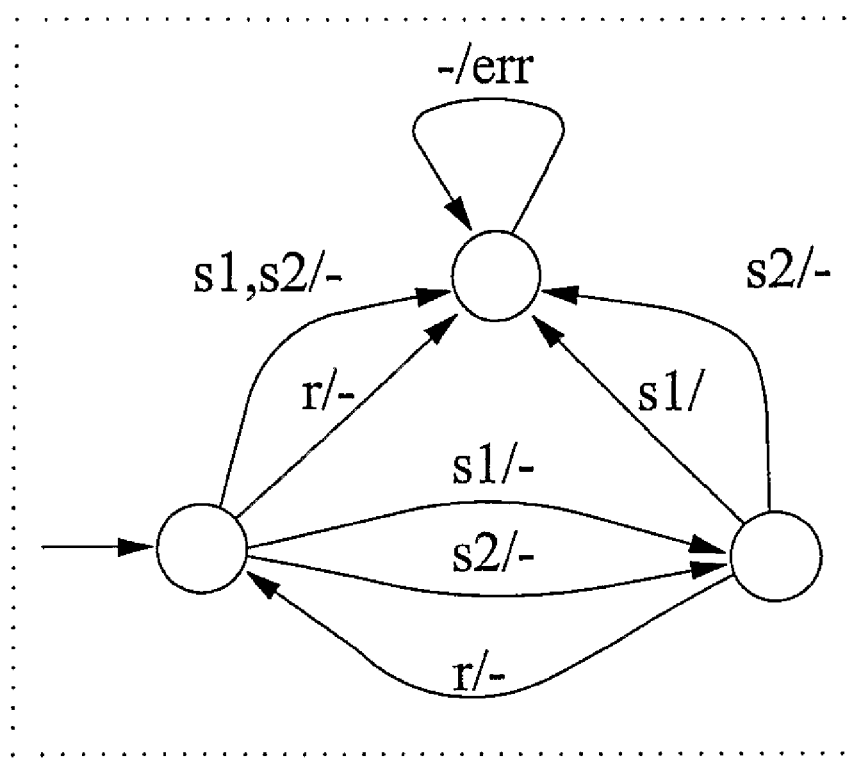
FIG. 9 is a Mealy-style diagram of a circuit for a sharing operation that issues an error signal.

The resulting circuit, synthesised using the rules before is shown in FIG. 8. However, this is obviously wrong: the two input signals will simply cancel each other in the XOR gate and the computation will halt. This illustrates the fact that sharing, as defined above, is only guaranteed to work in sequential composition. Moreover, the resulting bad behaviour can be completely unpredictable.

Synthesis of hardware from a functional specification using ICA or another high-level language can then be undertaken using a hardware description language such as Verilog. The synthesized hardware is particularly well suited for FPGAs, both because hardware synthesis from programming languages suits the rapid-design philosophy of FPGAs, and for the technical reason that FPGAs are rich in latches, which tend to be the most heavily used type of circuits in the resulting designs.

Another note on the implementation is that wherever possible it is advantageous to use combinatorial or asynchronous implementations in order not to introduce unnecessary extra clock cycles in the computation. It is worth emphasising that the modular nature of the synthesised circuitry does not require a global clock; technically speaking, the resulting circuit is a globally asynchronous locally synchronous (GALS) circuit.

The invention claimed is:

1. A method of building an electronic circuit for performing a function, the method comprising:
    programming said function using a programming language by defining one or more terms, each term comprising one or more functional constants;
    applying game semantics to interpret the programmed function, wherein each term is interpreted as one or more strategies defined on moves;
    associating each of said constants of the programmed function with a sub-circuit that comprises at least one input port and at least one output port, wherein each move is associated with at least one input or output port of the associated sub-circuit, and wherein a move occurrence defined by a strategy produces a change of state of an associated port;
    combining the associated sub-circuits to provide a synthesised circuit; and
    building said synthesised circuit as an electronic circuit for performing said function.

2. The method of claim 1 wherein each term of said programmed function is a sub-program comprising identifiers, procedure definitions and linear procedure calls.

3. The method of claim 2 wherein each sub-program is assigned one or more types and describes an operation on an argument, whereby each move is determined by the type of the programmed function and the types of its identifiers.

4. The method of claim 3 wherein the language is a linear-typed language, except that non-linear types are defined by use of a SHARE operation on an argument that returns two or more copies of the argument.

5. The method of claim 1 wherein said sub-circuit is configured such that a sequence of inputs/outputs to said ports corresponds with a strategy.

6. The method of claim 1, wherein the step of combining the associated sub-circuits comprises wiring together the associated sub-circuits.

7. The method of claim 6, wherein the step of combining the associated sub-circuits comprises wiring the associated sub-circuits that correspond to a procedure call to the sub-circuits that correspond to the argument.

8. The method of claim 1 further comprising defining the synthesised circuit in a hardware description language from which an IP core can be identified.

9. A method of building an electronic circuit for performing a function, the method comprising:
    programming said function using a programming language by defining one or more terms, each term comprising one or more functional constants, and wherein the language is a linear-typed language, except that non-linear types are defined by use of a SHARE operation on an argument that returns two or more copies of the argument;
    applying game semantics to interpret the programmed function, wherein each term is interpreted as one or more strategies defined on moves;
    associating each of said constants of the programmed function with a sub-circuit, wherein each move is associated with at least one input or output port of said sub-circuit such that a sequence of inputs/outputs to said ports corresponds with a strategy;
    combining the associated sub-circuits to provide a synthesised circuit; and
    building said synthesised circuit as an electronic circuit for performing said function.

* * * * *